United States Patent
Chen et al.

(10) Patent No.: US 6,320,762 B1
(45) Date of Patent: Nov. 20, 2001

(54) FIXED CONDUCTIVE PIN FOR PRINTED WIRING SUBSTRATE ELECTRONICS CASE AND METHOD OF MANUFACTURE THEREFOR

(76) Inventors: Shiaw-Jong S. Chen, 3805 Solarium Pl., Plano, TX (US) 75075; Roger J. Hooey, 501 Prince La., Rockwall, TX (US) 75087

(*) Notice: Subject to any disclaimer, the term of this patent is extended or adjusted under 35 U.S.C. 154(b) by 0 days.

(21) Appl. No.: 09/288,896

(22) Filed: Apr. 9, 1999

(51) Int. Cl.[7] ....................................... H05K 9/00
(52) U.S. Cl. ................. 361/818; 361/799; 361/800; 174/35 R
(58) Field of Search .................. 361/728, 736, 361/752, 796, 799, 800, 801, 816, 818; 174/35 R, 51; 211/41.17; 206/706, 719

(56) References Cited

U.S. PATENT DOCUMENTS

| | | | |
|---|---|---|---|
| 4,325,103 | * 4/1982 | Ito et al. | ................ 361/816 |
| 5,075,821 | * 12/1991 | McDonnal | ................ 361/721 |
| 5,081,434 | * 1/1992 | Sakamoto et al. | ................ 333/182 |
| 5,508,889 | * 4/1996 | Ii | ................ 361/816 |
| 5,835,350 | 11/1998 | Stevens | ................ 361/704 |
| 5,907,478 | * 5/1999 | Watanabe | ................ 361/807 |

FOREIGN PATENT DOCUMENTS

| | | |
|---|---|---|
| 1-196200 | * 8/1989 | (JP) . |
| 4-111397 | * 4/1992 | (JP) . |
| 10-41669 | * 2/1998 | (JP) . |

* cited by examiner

Primary Examiner—Jayprakash N. Gandhi

(57) ABSTRACT

An electronics case, a method of manufacturing the same and a power module incorporating the case. In one embodiment, the case includes: (1) an enclosure including a metal substrate that forms walls of the enclosure and a dielectric material located on inner surfaces of the walls that insulate the substrate from electronics components located within the enclosure and (2) an electrically conductive pin, affixed to a sidewall of the enclosure substrate and extending to without the enclosure, that allows the substrate to be electrically coupled to a structure supporting the case for EMI (electromagnetic interference) shielding or case-grounding purposes.

21 Claims, 4 Drawing Sheets

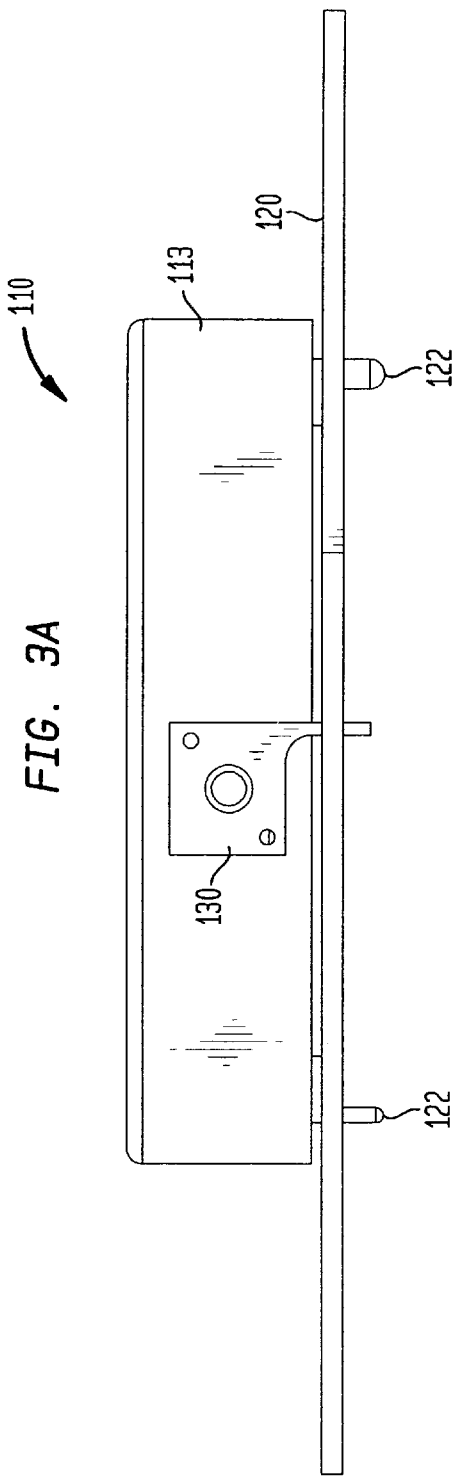
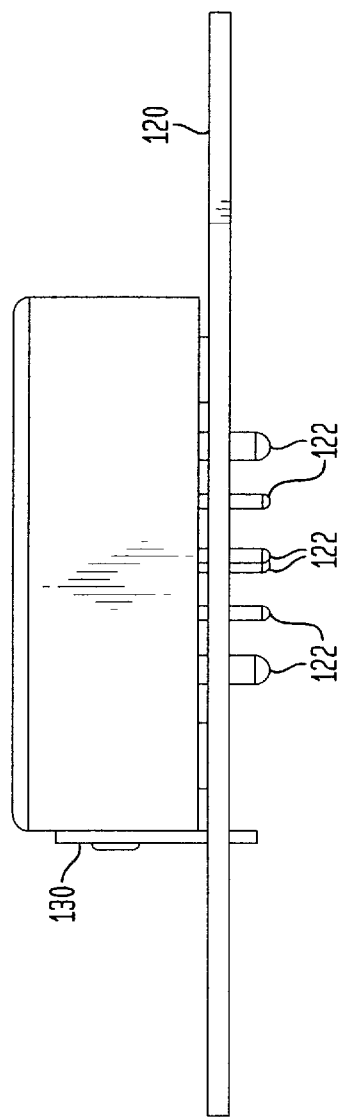

US 6,320,762 B1

FIXED CONDUCTIVE PIN FOR PRINTED WIRING SUBSTRATE ELECTRONICS CASE AND METHOD OF MANUFACTURE THEREFOR

TECHNICAL FIELD OF THE INVENTION

The present invention is directed, in general, to electronics packaging and, more specifically, to a fixed, electrically conductive pin for an electronics case that also serves as a printed wiring substrate and a method of manufacturing the same.

BACKGROUND OF THE INVENTION

Electronic devices for power supplies and similar applications are conventionally provided in a protective, heat-dissipation package. These board mounted power conversion modules are widely used in telecommunications or computer-related electronic data processing environments.

Similar to other consumer electronic products (for example, notebook computers), these board mounted power conversion modules are being packaged with more functions and more output power in smaller size, lighter weight, lower profile, and higher efficiency modules. The power density (total output power divided by the volume of the power module) of today's board mounted power modules is increasing as new products are introduced. However any improvements in power, density and profile cannot be at the expense of the electrical characteristics of the components and the overall power supply. A significant improvement in types of board mountable electronic devices was made in the encapsulated board mountable power supply of the type described in Stevens U.S. Pat. No. 5,835,350, entitled "Encapsulated, Board-Mountable Power Supply and Method of Manufacture Therefor." Such a device represents a significant manufacturing advance and convenience from both a time and monetary perspective.

While the invention described in Stevens provided a significant advance in the manufacture of electronic equipment, it shares a limitation with other new generation, small-sized, board mountable electronic circuits. That limitation is the fact that it lacks a convenient method of providing a case grounding connection between the substrate of the device housed in the case and the supporting substrate upon which the device is mounted.

Accordingly, what is needed in the art is a device or method to provide a case grounding connection between a substrate of a circuit contained in a board mountable case and the substrate that supports the cased circuit as a part or component of a larger circuit. Such a case grounding device or method must provide a reliable case ground while preserving the convenience of permitting an assembly process that only requires the cased circuit to be plugged into a supporting substrate. Preferably, the technique should be cost-effective and suitable for mass production.

SUMMARY OF THE INVENTION

To address the above-discussed deficiencies of the prior art, the present invention provides an electronics case, a method of manufacturing the same and a power module incorporating the case. In one embodiment, the case includes: (1) an enclosure including a metal substrate that forms walls of the enclosure and a dielectric material located on inner surfaces of the walls that insulate the substrate from electronics components located within the enclosure and (2) an electrically conductive pin, affixed to a sidewall of the substrate enclosure and extending to without the enclosure, that allows the substrate to be electrically coupled to a structure supporting the case.

The present invention therefore introduces the broad concept of providing a pin (most advantageously a case ground pin) that is directly affixed to a sidewall of an electronics enclosure/component substrate. In an embodiment to be illustrated and described, the pin is affixed by forming an aperture in the sidewall and riveting the pin to within the aperture.

In one embodiment of the present invention, the case further includes a plurality of electrically conductive traces located on the material and insulated from the substrate. In the embodiment to be illustrated and described, the pin passes through the material, and through an interior of the enclosure before extending to without the enclosure. Of course, the pin may protrude from the enclosure, never passing through its interior.

In one embodiment of the present invention, the components are components of a power converter. In the embodiment to be illustrated and described, the power converter components and case cooperate to form a power module, which may itself be board-mounted as a single unit. Thus, in one embodiment of the present invention, the structure is a printed circuit board having electrically conductive traces located thereon.

In one embodiment of the present invention, the case further includes an encapsulant at least partially occupying the enclosure. The encapsulant, while not necessary to the present invention, nonetheless provides support for electronic components within the enclosure and rigidity to the case as a whole.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIG. 3A illustrates a side elevational view of an electronics case mounted on a supporting substrate with electrical pins and an electrically conductive pin inserted through apertures on the supporting substrate;

FIG. 3B illustrates an end elevational view of an electronics case mounted on a supporting substrate with electrical pins and an electrically conductive pin inserted through apertures on the supporting substrate;

DETAILED DESCRIPTION

Figure 1:
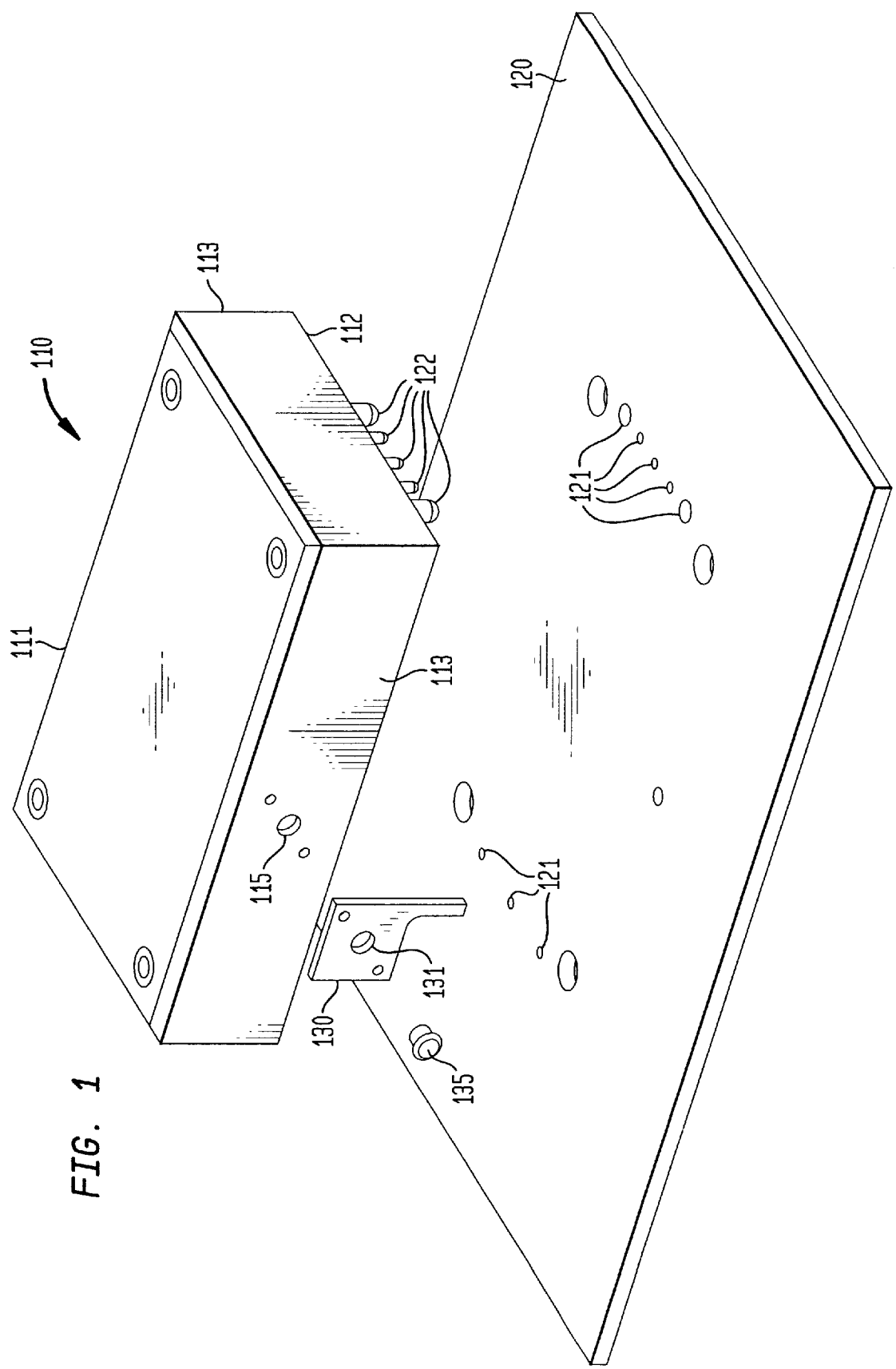
FIG. 1 illustrates an exploded isometric view of an electronics case, supporting substrate and electrically conductive pin.

Referring initially to FIG. 1, illustrated is an exploded isometric view of an electronics case 110, a supporting substrate 120 and an electrically conductive pin 130. The electronics case 110 is an enclosure that contains the various electronic components that make up an electronic circuit. The case 110 is formed from a metal substrate and usually only has a top wall 111 and sidewalls 113. When initially formed, illustrated embodiment of the case 110 has no bottom surface. As hereinafter described, the illustrated embodiment of the invention calls for the surface of the bottom 112 of the case 110 to be formed by an encapsulant around the components in the case 110.

The inner surface of the metal substrate making up the sides 113 and top 111 of the case 110 is lined with a dielectric material (not shown) that insulates the metal substrate from electronics components located within the case 110. The metal substrate of the case 110 also serves as a printed wiring or circuit board for the electronic components contained therein. In one embodiment of the invention, the electronic components contained within the case 110 make up a power converter. In another embodiment of the invention, the dielectric lining of the case 110 substrate makes up a printed circuit board with electrically conductive traces located thereon.

Extending from the bottom 112 of the case 110 are electrical pins 122 to provide electrical connectivity between the electronic components enclosed within the case 110 and the electronic circuit associated with the supporting substrate 120 upon which the case 110 is mounted. On the surface of the supporting substrate 120 are corresponding apertures 121 to accept the electrical pins 122 and complete the electrical connection between the components within the case 110 and the circuit located on or within the supporting substrate 120.

A mountable case 110 of the type illustrated, permits a manufacturer to use off-the-shelf preassembled circuits contained in cases 110, such as that illustrated, to assemble and manufacture electronic systems. This provides an advantageous manufacturing method for using electronic circuits of wide application that have become largely standardized, such as certain power supply configurations.

In some mountable cases 110, the circuit and components contained therein are held in place by an encapsulant, such as epoxy or some other dielectric polymers. The encapsulant occupies at least part of the case 110 enclosure and may actually be the surface that directly contacts the supporting substrate 120 when the case 110 is mounted. The encapsulant, while not necessary in some embodiments of the present invention, provides support for electronic components within the case 110 and rigidity to the case 110 as a whole. A power supply and method of manufacture of a mountable case 110 of this type is described in Stevens U.S. Pat. No. 5,835,350, entitled "Encapsulated, Board-Mountable Power Supply and Method of Manufacture Therefor," a copy of which is incorporated herein by this reference thereto.

Figure 2:
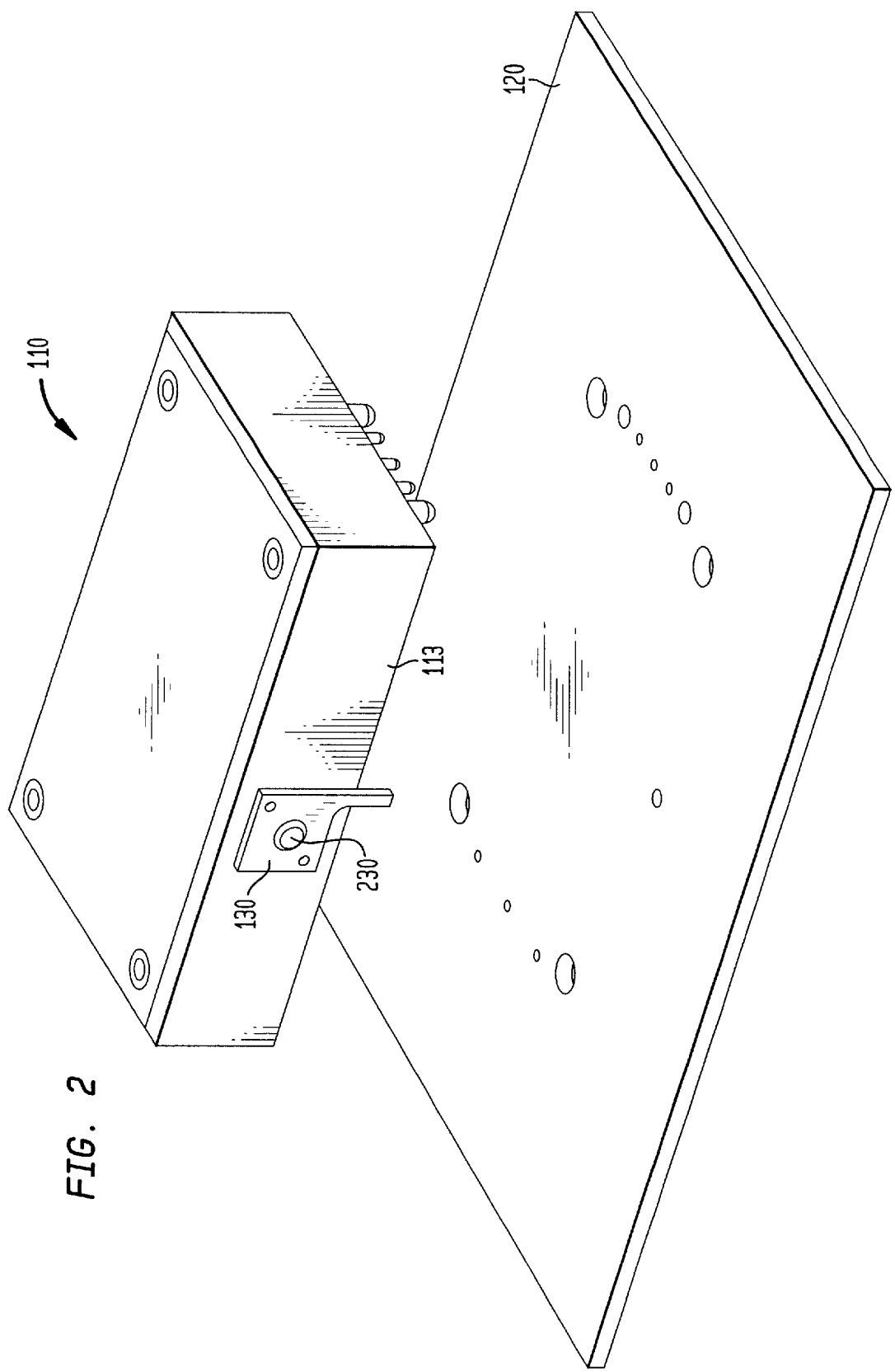
FIG. 2 illustrates an isometric view of an electronics case and supporting substrate with an electrically conductive pin to fastened to the side of the electronics case by a rivet joint.

Returning to FIG. 1, attached to one side 113 of the metal substrate that makes up the case 110 is an electrically conductive pin 130. In one embodiment on the invention, a rivet joint is used to affix the electrically conductive pin 130 to the surface 113 of the case 110. Illustrated is an exploded drawing of an embodiment of a rivet joint. To receive the rivet 135, the side 113 of the case 110 has an aperture 115 located thereon. A rivet 135 is inserted through the aperture 115 and a hole 131 in the electrically conductive pin 130. The rivet joint is then formed to secure the electrically conductive pin 130 to the case 110. Turning to FIG. 2, illustrated is an isometric view of the case 110 and supporting substrate 120 with the electrically conductive pin 130 fastened to the side 113 of the case by a rivet joint 230.

Turning now to FIGS. 3A and 3B, illustrated are elevational views of the case 110 mounted on a supporting substrate 120. FIG. 3A is a side 113 elevational view of the case 110 mounted on the supporting substrate 120 with electrical pins 122 and the electrically conductive pin 130 inserted in apertures 121 (see FIG. 1) on the supporting substrate 120. FIG. 3B is an elevational end view of the case 110 mounted on the supporting substrate 120. It is readily apparent that, when the case 110 is mounted on the supporting substrate 120, the electrically conductive pin 130 provides a case ground connection between the metal substrate of the case 110 and the supporting substrate 120.

Figure 4:
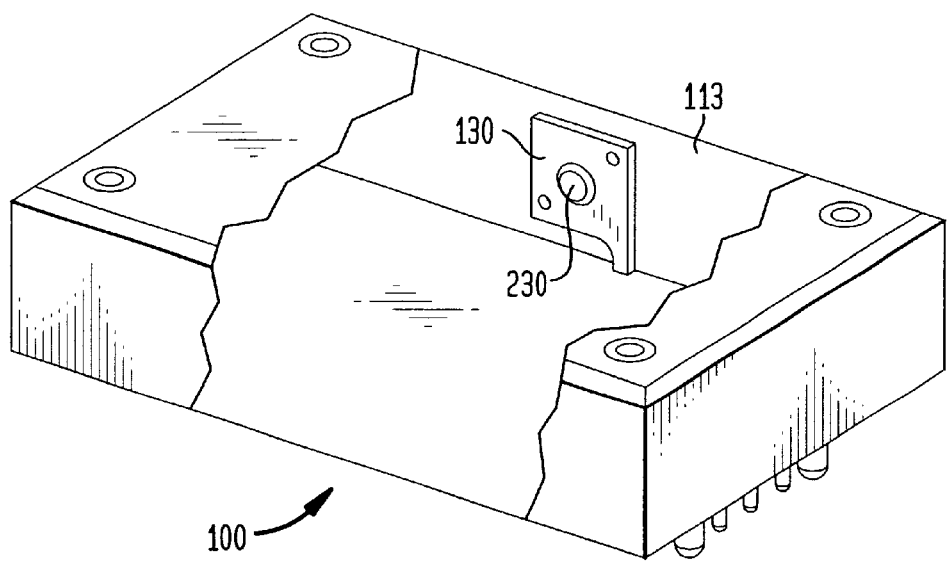
FIG. 4 illustrates a cut away isometric view of an electronics case showing an embodiment of the invention with the electrically conductive pin fastened to an interior sidewall.

Turning to FIG. 4, illustrated is a cut away isometric view of the case 110 showing an embodiment of the invention with the electrically conductive pin 130 fastened to an interior sidewall 113. In one embodiment of the invention, a rivet joint 230 is used to fasten the electrically conductive pin 130 to the interior sidewall 113. Those skilled in the art understand, however, that other methods, now known or later discovered, to secure the electrically conductive pin 130 to the interior sidewall 113 are well within the scope of the current invention. One such other method to secure the electrically conductive pin 130 to the interior sidewall 113 has the pin 130 located against the sidewall 113 and the case filled with an encapsulant that holds the pin 130 in place. In one embodiment of the invention, the case 110 is mounted on a supporting substrate 120 with the pin 130 fastened to an interior sidewall 113 and passing through the interior of the case 110 and the dielectric material that lines the interior walls 113 before it extends out of the case 110.

Figure 5:
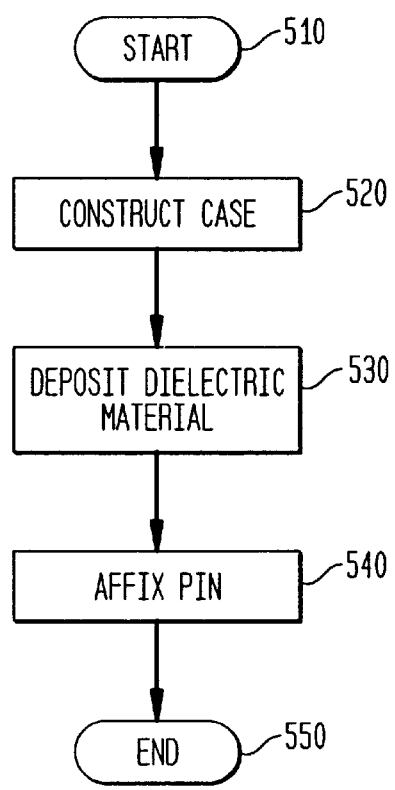
FIG. 5 is a flow diagram of a method of manufacturing an embodiment of an electronics case that is constructed in accordance with the principles of the present invention.

Turning now to FIG. 5, illustrated is a flow diagram of an embodiment of a method of manufacturing an electronics case 110 according to the principles of the present invention. The method begins at a start step 510. The next step is to fold a metal substrate to form the walls and top of an enclosure having a reservoir therein during a construct case step 520. The peripheral walls may be sealed through several methods such as, without limitation, applying an adhesive, applying an interference-fit plastic insert, welding the corners of the walls, or soldering the interior corners to provide a solderable pattern on an interior layer of the case. Regardless of the selected method, if an encapsulant is to be placed in the case, the corners should be meticulously sealed to prevent escape of the encapsulant while placing the encapsulant within the case or during curing of the encapsulant.

A dielectric material is then deposited on the inner surfaces of the case walls during a deposit dielectric material step 530. The dielectric material provides insulation for electronic components to be located within the case. Of course, it is well within the scope of the current invention if the dielectric material is deposited on the substrate before the construct case step 520. In one embodiment of manufacturing the electronics case, a plurality of electrically conductive traces are located on the dielectric material, which electrically conductive traces are insulated from the metal substrate. The electrically conductive traces are placed on the dielectric material at such time, or times, as those skilled in the art determine.

The electrically conductive pin 130 illustrated as being affixed to the side of the case in an affix pin step 540. The conductive pin 130 can be either placed within or without the case and still be within the scope of the invention. During the affix pin step 540, the pin is located so that the metal substrate of the case is electrically coupled to a supporting substrate structure on which the case is mounted. In one embodiment, the affix pin step 540 includes riveting the electrically conductive pin 130 to a sidewall (such as the sidewall 113 of FIG. 1) of the case. During the affix pin step 540, the pin can be located so that it passes through the interior of the case enclosure before extending without the enclosure.

Other manufacturing embodiments steps within the scope of the present invention include a step to install the electronic components of a power converter (not shown) and at least partially filling the enclosure with an encapsulant (not shown), which steps occur at such time as those skilled in the art determine to be best. If an encapsulant is used to partially fill the enclosure, environmental protection (e.g., protection from dirt and moisture) for the electronic components located within the case is provided. The manufacturing method concludes at an end step 550.

The completed case, which may be a power module, can then be coupled to a printed wiring or circuit supporting substrate using any number of techniques including, without limitation, through hole attachment, surface mounting, connector attachment or mechanical piece part attachment (e.g., compression mounting).

The electronics case 110 is constructed according to the principles of the present invention as described with respect to the preceding FIGURES. The aforementioned electronics case 110 and method of manufacturing are submitted for illustrative purposes only. Other case embodiments and alternative methods of manufacturing in accordance with the general principles as submitted herein are well within the broad scope of the present invention.

The foregoing has outlined, rather broadly, preferred and alternative features of the present invention so that those skilled in the art may better understand the invention. Although the present invention has been described in detail, those skilled in the art should understand that they can make various changes, substitutions and alterations herein without departing from the spirit and scope of the invention in its broadest form.

What is claimed is:

1. An electronics case, comprising:
    an enclosure including a metal substrate that forms walls of said enclosure and a dielectric material located on inner surfaces of said walls that insulate said substrate from electronics components located within said enclosure; and
    an electrically conductive pin connected to said components and extending from inside to without said enclosure, said pin allowing said components and said substrate to be electrically coupled to a structure supporting said case.

2. The case as recited in claim 1 wherein a rivet joint affixes said pin to said sidewall.

3. The case as recited in claim 1 further comprising a plurality of electrically conductive traces located on said material and insulated from said substrate.

4. The case as recited in claim 1 wherein said pin passes through an interior of said enclosure before extending to without said enclosure.

5. The case as recited in claim 1 wherein said components are components of a power converter.

6. The case as recited in claim 1 further comprising an encapsulant at least partially occupying said enclosure.

7. The case as recited in claim 1 wherein said structure is a printed circuit board having electrically conductive traces located thereon.

8. A method of manufacturing an electronics case, comprising:
    forming walls of an enclosure with a metal substrate;
    depositing a dielectric material on inner surfaces of said walls to provide insulation for electronics components to be located within said enclosure; and
    connecting an electrically conductive pin to said components, said pin extending from inside to without said enclosure and allowing said components and said substrate to be electrically coupled to a structure supporting said case.

9. The method as recited in claim 8 wherein said affixing comprises riveting said pin to said sidewall.

10. The method as recited in claim 8 further comprising forming a plurality of electrically conductive traces on said material, said plurality of traces insulated from said substrate.

11. The method as recited in claim 8 wherein said pin passes through an interior of said enclosure before extending to without said enclosure.

12. The method as recited in claim 8 wherein said components are components of a power converter.

13. The method as recited in claim 8 further comprising at least partially filling said enclosure with an encapsulant.

14. The method as recited in claim 8 wherein said structure is a printed circuit board having electrically conductive traces located thereon.

15. A power module, comprising:
    an enclosure including a metal substrate that forms walls of said enclosure and a dielectric material located on inner surfaces of said walls;
    power converter components coupled to said material, said material insulating said substrate from said power converter components; and
    an electrically conductive pin connected to said components and extending to from inside without said enclosure, said pin allowing said components and said substrate to be electrically coupled to a structure supporting said power module.

16. The power module as recited in claim 15 wherein a rivet joint affixes said pin to said sidewall.

17. The power module as recited in claim 15 further comprising a plurality of electrically conductive traces located on said material and insulated from said substrate.

18. The power module as recited in claim 15 wherein said pin passes through an interior of said enclosure before extending to without said enclosure.

19. The power module as recited in claim 15 wherein said components are components of a power converter.

20. The power module as recited in claim 15 further comprising an encapsulant at least partially occupying said enclosure.

21. The power module as recited in claim 15 wherein said structure is a printed circuit board having electrically conductive traces located thereon.

* * * * *